United States Patent [19]

Schneider

[11] 4,359,487
[45] Nov. 16, 1982

[54] METHOD FOR APPLYING AN ANTI-REFLECTION COATING TO A SOLAR CELL

[75] Inventor: Michael Schneider, Summit, N.J.

[73] Assignee: Exxon Research and Engineering Co., Florham Park, N.J.

[21] Appl. No.: 310,330

[22] Filed: Oct. 9, 1981

Related U.S. Application Data

[63] Continuation-in-part of Ser. No. 167,417, Jul. 11, 1980, abandoned.

[51] Int. Cl.³ .................... H01L 31/00; B05D 1/18; B05D 1/38
[52] U.S. Cl. ..................................... 427/75; 427/162
[58] Field of Search ........................ 427/74, 75, 162

[56] References Cited

U.S. PATENT DOCUMENTS 3,904,453  9/1975  Revesz et al. .................... 427/74 X
3,949,463  4/1976  Lindmayer et al. .............. 427/75 X

*Primary Examiner*—James R. Hoffman
*Attorney, Agent, or Firm*—Paul E. Purwin; Ronald D. Hantman

[57] ABSTRACT

The present invention teaches a method for applying an anti-reflection coating to solar cells whereby the coating is interdispersed among the cell's electrodes on the cell's junction surface. The method includes coating the solar cell's surface with an anti-reflection layer, selectively etching a pattern through the anti-reflection layer, which corresponds to the desired electrode pattern and electrolessly plating a layer of nickel onto the cell's surface.

16 Claims, 3 Drawing Figures

METHOD FOR APPLYING AN ANTI-REFLECTION COATING TO A SOLAR CELL

CROSS-REFERENCE TO RELATED APPLICATIONS

This is a continuation-in-part of Ser. No. 167,417, filed July 11, 1980, now abandoned.

BACKGROUND OF THE INVENTION

The present invention relates to solar cells and in particular to solar cells having an anti-reflection coating which is applied to the solar cell prior to electroding.

Photovoltaic devices such as silicon solar cells promise a viable alternative to non-replenishable fossil fuel energy generation. Light energy (photons) incident on a solar cell's surface must enter and be absorbed within the cell to be converted to electrical energy. The efficiency of the solar cell is directly proportional to the amount of light absorbed by the cell.

Depending upon the particular cell fabrication process, the surface of the solar cell may be substantially reflective of light energy, reducing the solar cell's efficiency. Polished silicon, for example, may have a reflectivity of 40% in the spectral region of 0.35 and 1.2 microns. The problem is well recognized in the art and numerous solutions have been employed. A known effective technique for reducing the unwanted reflection is an anti-reflection layer in contact with the solar cell's surface. The anti-reflection (hereinafter A-R) layer is selected to coordinate its index of refraction, thickness and transmittance characteristics to surface reflection characteristics and the spectral region of interest. For silicon solar cells having a principal spectral absorbance between 0.35 and 1.2 microns, metal oxides such as tin oxide and titanium dioxide as well as magnesium fluoride are known anti-reflective coatings. Typically these layers are applied to the cell's surface after the cell fabrication has been completed, coating virtually the entire cell surface including the cell's electrodes. Applying the A-R coating after the completion of the cell restricts the temperature at which the A-R coating may be applied or treated. In contrast to the typical coating sequence, the present invention teaches an A-R coating method where an A-R layer precedes the electroding of the solar cell, avoiding the temperature limitations of the aforedescribed prior art process. The process is of further advantage in permitting electrical contact to the cell's electrode after the A-R coating, facilitating automated production of solar cells and solar panel assembly.

The art has generally recognized the advantage of exposing at least a portion of the solar cell's electrodes through the A-R coating. In U.S. Pat. No. 3,949,463, for example, Lindmayer et al teach a method for applying an A-R coating to a silicon solar cell where the A-R coating does not overcoat the cell's current collecting electrode. The technique is further exemplified in U.S. Pat. No. 3,904,453 where Revesz et al use photolithographic techniques in the formation of solar cell electrodes which are not overcoated with the cell's A-R coating.

SUMMARY OF THE INVENTION

The present invention teaches an improved solar cell having an A-R coating which is applied to the cell prior to constructing the cell's electrodes. Junction diffused silicon wafers are coated with an A-R layer by either spin-on coating or spray deposition, both techniques employing a heating of the cell at about 200° C. to about 300° C. An electrode pattern is masked onto the A-R coated surface and the A-R coating is removed from the unmasked regions by chemical etching means to expose the solar cell's surface. The etched region is contacted with an electroless nickel sensitizer and plated with a layer of electroless nickel plating. The electrode pattern mask is then removed and the nickel plated electrodes are contacted with solar flux and molten solder which forms a layered nickel/solder electrode interdispersed through the A-R coating. The process taught herein permits heat treatment/heat processing of the A-R coating and facilitates electrical connections to the A-R coated cell.

BRIEF DESCRIPTION OF THE DRAWING

In the drawing, where like components are commonly designated.

DETAILED DESCRIPTION OF THE INVENTION

Figure 1:
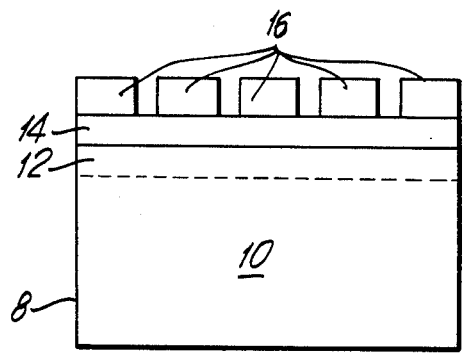
FIGS. 1 through 3 illustrate cross-sectional views of the solar cell during successive steps in the fabrication technique of the present invention.

In FIG. 1, a silicon wafer 8 having a first type conductivity region 10 which may comprise P-type or N-type silicon, is diffused to form a region 12 of conductivity type opposite to that of region 10, forming a semiconductor junction otherwise termed a P-N (or N-P) junction in the region of the interface between regions 10 and 12. The diffusion and junction forming processes are well known in the art. Furthermore, the present inventive A-R coating is operable for either N on P or P on N type cells. In a preferred embodiment, diffused layer 12 extends a relatively short distance into the wafer to form a shallow junction, less than about 0.5 microns in depth.

The diffused cell is then optionally etched in a buffered solution of hydrofluoric acid to remove surface oxidation and possible adsorbed contaminants. The cell is then coated with an A-R layer 14. Suitable A-R layers include titanium dioxide ($TiO_x$), silicon dioxide ($SiO_x$), magnesium fluoride, and silicon nitride. As recognized by those of the art, the precise oxidation state of the A-R layer 14 may vary dependent upon the material used and its preparation conditions; however, oxidation state variations are compensated for in adjusting the thickness of the layer to provide the desired optical properties of the A-R layer.

The formation of A-R layer 14 is, itself, known in the art, and may comprise the alternate techniques described hereinbelow. The thickness and refractive index of the particular A-R coating utilized are approximated by the theoretical relationship for constructive interference in the A-R coating; $d = \lambda/4n$ where d is the approximate thickness of the A-R layer, $\lambda$ is wavelength, and n is the refractive index of the A-R coating material.

Spin-On Coating: Layer 14 may be formed by applying an amount of spin-on coating precursor material such as a solution of compounds of titanium and silica in an anhydrous mixed alcohol based solvent, commercially available from Emulsiton Corporation under the trade name of "Titaniumsilica Film C". The coating is applied by the known technique of contacting the cell surface with the coating liquid and spinning the cell in commercial photoresist spinner means. Layer thickness is controlled by regulating the amount of liquid applied to the surface and the spinning speed which controls the centrifugal liquid spreading force. Approximate regulation of the layer thickness may be provided by monitoring the interference color of the layer, whereby a deep blue reflection color is indicia of an appropriate thickness for the A-R coating. The spin-on coated layer is then densified by heat treating the cell at a temperature ranging from about 200° C. to about 400° C. for a time ranging from about 15 min. to about 30 min. The coating is a mixture of the oxides of titanium and silicon.

Spray Deposition: The A-R layer may be fabricated by thermal decomposition of a solution containing a metal solute which will decompose to the desired metal oxide upon heating. Spraying (or misting) the solution onto a heated cell is a conventional deposition technique which provides a controlled growth of the metal oxide A-R layer. Particular spray solution compositions, spray rates and decomposition temperatures are known in the art and, as is the case with each of the A-R layer compositions recited herein, constitute no part of the present invention.

Vacuum Deposition: Several alternate vacuum deposition techniques are known for depositing metal oxide for forming the A-R coating including sputtering, electron beam and ion beam deposition. Although generally more costly, vacuum deposition techniques generally facilitate accurate control over layer thickness.

Each A-R layer construction technique taught herein requires elevated temperature processing which, for cells having electrodes previously constructed onto the cell's surface, may cause temperature damage to the electrode itself or migration of the electrode material into and through the junction barrier, particularly when the junction is of the shallow type where junction regions are relatively near the electrode surface.

Figure 2:
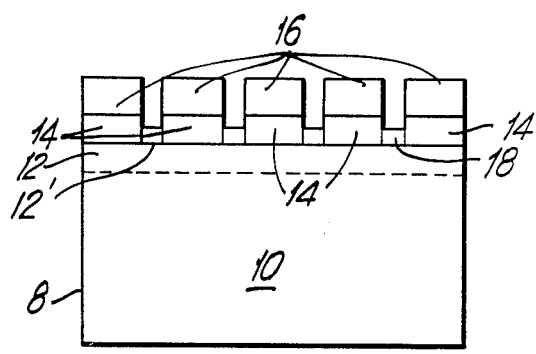

The A-R coated surface is then masked to expose only that area of the cell surface which corresponds to the desired electrode pattern. Accordingly a layer 16 may alternatively comprise a silk screened asphalt based ink mask patterned onto A-R layer 14 or a photoresist material which has been patterned by photolithographic means to provide a masking layer exposing a region of A-R layer 14 which corresponds to the desired electrode pattern. The masked surface is then contacted with an etchant chosen to provide selective etching of the particular A-R coating composition employed. For example, where A-R coating 14 comprises a layer of $TiO_x$, fabricated by heat treated spin-on deposition, an etching solution of buffered hydrofluoric acid is used to selectively remove the A-R coating in the unmasked regions of the cell surface. Referring to FIG. 2, it is to be recognized that the etching solution is chosen to selectively etch the A-R coating in preference to the underlying silicon layer 12. Furthermore, the solution concentration of the etchant is selected to minimize etchant undercutting of the mask. Accordingly, the etching solution removes the unmasked regions of A-R layer 14 which correspond to the desired electrode pattern, exposing the underlying silicon surface 12'.

The cell is then prepared for plating by contacting at least the exposed silicon regions 12' with an electroless nickel sensitizer such as gold cyanide or gold chloride, for example. The cell is then subjected to electroless nickel plating which comprises contacting at least the sensitized exposed silicon regions with an electroless nickel plating solution to electrolessly plate a layer of nickel 18 onto at least the sensitized exposed silicon surface 12'. Nickel layer 18 in the region contacting the formerly exposed silicon surface is about 0.1 microns in thickness.

Figure 3:
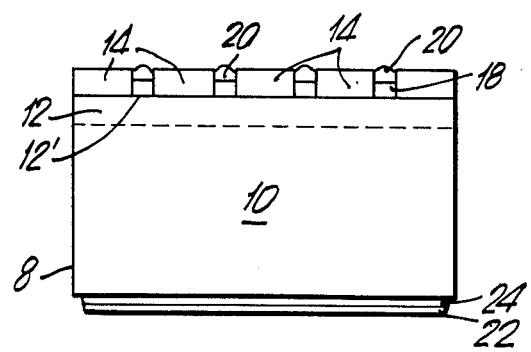

Subsequent to the electroless nickel deposition, masking layer 16 is removed using a suitable solvent. The removal of masking layer 16 further removes stray nickel deposition which may at least partially overcoat masking layer 16. Referring to FIG. 3, the removal of masking layer 16 produces a cell having an A-R coating 14 and an inter-dispersed electrode 18. In a preferred embodiment, the cell is heat treated at a temperature ranging from about 250° C. to about 350° C. to improve the adherence of the electroless nickel layer 18 to the underlying silicon 12.

Electrolessly deposited nickel layer 18 is insufficiently conductive to serve as a suitable current carrying electrode for most solar cell applications. Accordingly, a conduction supportive electrode layer 20 comprising a relatively high electroconductivity metal may be formed by solder dipping, electroplating or the like. In a preferred embodiment, the surface area of the cell comprising at least the nickel electrode 18 is contacted first with a solder flux agent and then with molten solder to form layer 20 comprising solder. In an alternate embodiment prior to the aforedescribed addition of a conduction supporting electrode layer, a generally circular outer circumferential region of both surfaces of the silicon cell is etched using an etchant comprising a mixture of hydrofluoric and nitric acids. This process of edge region etching reduces the probability of edge region leakage currents and is well known in the art. A suitable masking pattern, generally circular and slightly less in diameter than the generally circular solar cell may be used to confine the etching to the outer circumferential edge regions of the cell.

An ohmic electrode may be formed concurrent to the formation of layers 18 and 20 comprising a first region 24' layer of electroless nickel and a second region layer 22' comprising solder for example. As taught with respect to layer 18, layer 22 may preferably be heat treated to increase its adherence to silicon layer 10.

As readily recognized from the teaching of the present specification, this invention is of advantage in permitting heat treatment of the cell after application of the A-R coating and of further advantage in facilitating electrical connection to the A-R coated cell. To assist one skilled in the art, the following examples detail a particular embodiment of the present invention.

EXAMPLE 1

A 5.6 cm diameter N-type single crystal silicon wafer was diffused to form a P-N junction having a relatively shallow junction depth of about 0.3 microns. The diffused wafer was then cleaned in a solution of hydrofluoric acid to remove surface oxidation, rinsed in distilled deionized water, and blown dry. The cleaned cell was then placed on a photoresist spinner and, using an eye dropper, an amount of a solution of *Titaniumsilica* Film C, commercially available from the Emulsitone Corporation located in Whippany, New Jersey, was applied to the cell's junction surface. The solution was spin coated at approximately 3,500 rpm for about 10 seconds. The cell was then heat treated at a temperature of about 200° C. to cure and densify the A-R coating. After cooling, the cell's coating was visually observed to be deep blue in color having a relatively hard, mar-resistant surface. The A-R coated cell was then masked by silk screening an asphalt based ink, patterned to expose the A-R layer only in a region to correspond to the desired electride pattern. The mask pattern was baked at about 100° C. to cure the asphalt based ink and assure the adherence of the mask during the subsequent processing steps. The desired electrode pattern was a central, tapered width bus, tapering from about 4 mm near one circumference of the cell to about 2 mm near the diametrically opposed circumference of the cell. Eighteen grid line electrodes, generally perpendicular to the bus and approximately equally spaced, were about 0.3 mm in width. The masked surface was then immersed in a dilute, buffered hydrofluoric acid etch comprising a well known etchant mixture of 15 parts by weight of ammonium fluoride and eight parts water, this being mixed in a ratio of 4 to 1 with hydrofluoric acid. The etchant removed the $TiO_x$ A-R layer in the exposed (unmasked) areas, exposing the underlying silicon layer. Visual observance of the surface revealed virtually no undercutting or lifting of the mask. The cell was then immersed in an electroless gold sensitizer comprising 50 ml hydrofluoric acid, 50 ml of 0.5% w/v of gold chloride and 900 ml of water which solution coated both the etched surface and the back of the cell (the N-type surface). The sensitized cell was then immersed in an electroless nickel plating solution comprising 65 gm ammonium acetate, 50 gm of ammonium chloride, 30 ml of nickel chloride and 10 gm of sodium hypophosphate. Electroless plating continued for about 10 minutes, whereafter the cell was rinsed in distilled deionized water and blown dry. The masking layer was than removed from the cell in a chloronated solvent such as Inhibisol, a trade name of the Pentone Corporation of Tenafly, New Jersey. The removal of the mask also removed any stray nickel deposit, leaving essentially the desired grid pattern on the cell's top surface and an approximately full surface coverage of the bottom (N-type) surface. The outer circumferential region of each surface was then ground to minimize leakage current paths through the cell's edge. The cell was then heat treated at about 300° C. for about 15 minutes to improve the adherence of the nickel to the silicon and alleviate edge grinding work damage. The cell was then immersed in solder flux and dipped into a molten solder bath which adhered to the nickel plated electrode areas of both surfaces, completing the fabrication of the cell.

The cell's reflectivity characteristics were determined using a Beckman Model #DK-1a spectrometer fitted with an integrating sphere for measuring total spectral and diffuse reflection. The cell having an A-R coating in accordance with the present invention had an average reflectance of about 3% in the spectral region of about 0.4 microns to about 1.1 microns as compared to a typical reflectance of 30% for conventionally prepared cells.

What is claimed is:

1. A method for applying an anti-reflective coating and an electrode pattern to a solar cell surface, said method comprising:
   coating at least said surface with an anti-reflection layer;
   masking a portion of said coated surface to form an electrode pattern in at least a portion of said surface which remains unmasked;
   etching said coating in the unmasked portion of said surface to remove said anti-reflection layer;
   sensitizing at least said etched region of said solar cell surface;
   electrolessly plating a layer comprising nickel onto at least said sensitized region of said solar cell surface;
   removing said masking from said solar cell surface whereby said nickel layer remains only in said electrode pattern;
   coating said nickel layer with a layer of electrically conducting material.

2. The method of claim 1 wherein said anti-reflection coating is a metal oxide.

3. The method of claim 1 wherein said anti-reflection coating comprises an oxide of titanium.

4. The method of claim 1 wherein said anti-reflection coating comprises an oxide of silicon.

5. The method of claim 1 wherein said anti-reflection coating is a mixture of titanium oxide and silicon oxide.

6. The method of claim 5 wherein said anti-reflection oxide is formed by spin-on coating said surface with a precursor solution to form a mixture of the oxides of titanium and silicon.

7. The method of claim 6 wherein said spin-on coating is subsequently heat treated at a temperature ranging from about 200° C. to about 400° C. for a period ranging from about 15 minutes to about 30 minutes.

8. The method of claim 5 wherein said oxide coating is formed by spraying a precursor solution to form a mixture of the oxides of titanium and silicon.

9. The method of claim 1 wherein said anti-reflection coating is magnesium fluoride.

10. The method of claim 1 wherein said anti-reflection coating is silicon nitride.

11. The method of claim 1 wherein said masking comprises screening an asphalt based ink coating a portion of at least one surface of said solar cell, which coating is patterned to expose an area of said surface which corresponds to an electrode pattern for said solar cell.

12. The method of claim 1 wherein said electroless nickel plating comprises contacting at least said etched surface and a bottom surface of said solar cell with an electroless plating solution comprising ammonium acetate, ammonium chloride, nickel chloride and sodium hypophosphate.

13. The method of claim 12 wherein said plating produces a layer of nickel ranging in thickness from about 0.08 microns to about 1.2 microns.

14. The method set forth in claim 13 wherein said nickel layer is heat treated at a temperature ranging from about 250° C. to about 350° C. for a time period ranging from about 10 minutes to about 30 minutes.

15. The method of claim 1 wherein said electrically conductins metal comprises solder.

16. The method of claim 15 wherein said solder is coated onto said nickel layer by contacting said nickel layer with molten solder.

* * * * *